United States Patent
Mitsuda et al.

(10) Patent No.: US 10,018,665 B2
(45) Date of Patent: Jul. 10, 2018

(54) POWER CONVERSION APPARATUS, STATUS DETECTION DEVICE, AND METHOD FOR STATUS DETECTION

(71) Applicant: KABUSHIKI KAISHA YASKAWA DENKI, Kitakyushu-shi (JP)

(72) Inventors: Kenji Mitsuda, Kitakyushu (JP); Hiroshi Takagi, Kitakyushu (JP)

(73) Assignee: KABUSHIKI KAISHA YASKAWA DENKI, Kitakyushu-shi (JP)

(*) Notice: Subject to any disclaimer, the term of this patent is extended or adjusted under 35 U.S.C. 154(b) by 332 days.

(21) Appl. No.: 14/744,481

(22) Filed: Jun. 19, 2015

(65) Prior Publication Data

US 2015/0369852 A1 Dec. 24, 2015

(30) Foreign Application Priority Data

Jun. 20, 2014 (JP) ................................ 2014-127703

(51) Int. Cl.
*G01R 31/02* (2006.01)
*G01R 31/07* (2006.01)
(Continued)

(52) U.S. Cl.
CPC ............ *G01R 31/07* (2013.01); *H02M 5/458* (2013.01); *H02M 1/32* (2013.01)

(58) Field of Classification Search
CPC ... G01V 3/02; G01V 3/04; G01V 3/06; G01V 3/08; G01R 31/07; H02M 3/3155; H02M 3/33507; H02M 3/33546
See application file for complete search history.

(56) References Cited

U.S. PATENT DOCUMENTS

| 9,240,731 B2* | 1/2016 | Wei ....................... H02M 5/458 |
| 2003/0052666 A1* | 3/2003 | Prineppi ............... G01R 31/024 |
| | | 324/133 |

(Continued)

FOREIGN PATENT DOCUMENTS

| CN | 1128424 A | 8/1996 |
| CN | 101981800 A | 2/2011 |

(Continued)

OTHER PUBLICATIONS

Office Action dated Aug. 22, 2017 in Japanese Patent Application No. 2014-127703 (with unedited computer generated English translation).

(Continued)

*Primary Examiner* — Tung X Nguyen
*Assistant Examiner* — Dominic Hawkins
(74) *Attorney, Agent, or Firm* — Oblon, McClelland, Maier & Neustadt, L.L.P.

(57) ABSTRACT

A power conversion apparatus includes a power conversion device connected to a 3-phase AC power source, a first fuse positioned on a first phase of the source between the conversion device and the source, a second fuse positioned on a second phase of the source between the conversion device and the source, a first voltage detection device which detects first voltage between a third phase and the first phase of the source on the conversion device side with respect to the first fuse, a second voltage detection device which detects second voltage between the third and second phases of the source on the conversion device side with respect to the second fuse, and a status detection device connected to the first and second voltage devices such that the status device detects status of the first and second fuses based on comparison between detection result of the first and second voltage.

19 Claims, 7 Drawing Sheets

(51) Int. Cl.
*H02M 5/458* (2006.01)
*H02M 1/32* (2007.01)

(56) References Cited

U.S. PATENT DOCUMENTS

| | | | | |
|---|---|---|---|---|
| 2008/0080106 | A1* | 4/2008 | Mirafzal | H02M 1/12 361/42 |
| 2008/0130335 | A1* | 6/2008 | Yuzurihara | H02M 7/125 363/125 |
| 2009/0168474 | A1* | 7/2009 | Katoh | H02J 3/01 363/78 |
| 2010/0271045 | A1* | 10/2010 | Oka | G01R 31/07 324/550 |
| 2011/0204870 | A1* | 8/2011 | Tsutada | H01H 33/593 323/355 |
| 2011/0225442 | A1* | 9/2011 | Benecke | H02P 1/46 713/340 |
| 2012/0293896 | A1* | 11/2012 | Mori | H02H 9/002 361/35 |
| 2013/0113507 | A1* | 5/2013 | Danesh | G01R 21/133 324/713 |
| 2013/0214708 | A1* | 8/2013 | Saeki | H02M 5/4585 318/376 |
| 2014/0333311 | A1* | 11/2014 | Liu | G01R 19/0038 324/418 |
| 2015/0229234 | A1* | 8/2015 | Park | H02M 1/12 363/78 |

FOREIGN PATENT DOCUMENTS

| | | |
|---|---|---|
| JP | 1-207667 A | 8/1989 |
| JP | 3-11925 A | 1/1991 |
| JP | 2004-088865 A | 3/2004 |

OTHER PUBLICATIONS

Combined Office Action and Search Report dated Jul. 5, 2017 in Chinese Patent Application No. 201510344325.6 (with English language translation).
Office Action dated Mar. 14, 2018, in Chinese Patent Application No. 201510344325.6 (with English-language translation).

* cited by examiner

POWER CONVERSION APPARATUS, STATUS DETECTION DEVICE, AND METHOD FOR STATUS DETECTION

CROSS-REFERENCE TO RELATED APPLICATIONS

The present application is based upon and claims the benefit of priority to Japanese Patent Application No. 2014-127703, filed Jun. 20, 2014, the entire contents of which are incorporated herein by reference.

BACKGROUND OF THE INVENTION

Field of the Invention

The embodiments of the present invention disclosed herein relate to a power conversion apparatus, a status detection device and a method for status detection.

Description of Background Art

The melted state of a fuse may be detected without using a mechanical contact switch but instead having it based on a voltage outputted from a rectifier diode provided in a power conversion device (see, for example, JP2004-88865A). The entire contents of this publication are incorporated herein by reference.

SUMMARY OF THE INVENTION

According to one aspect of the present invention, a power conversion apparatus includes a power conversion device connected to a 3-phase AC power source, a first fuse positioned on a first phase of the 3-phase AC power source between the power conversion device and the 3-phase AC power source, a second fuse positioned on a second phase of the 3-phase AC power source between the power conversion device and the 3-phase AC power source, a first voltage detection device which detects first voltage between a third phase of the 3-phase AC power source and the first phase of the 3-phase AC power source on a power conversion device side with respect to the first fuse, a second voltage detection device which detects second voltage between the third phase of the 3-phase AC power source and the second phase of the 3-phase AC power source on a power conversion device side with respect to the second fuse, and a status detection device connected to the first and second voltage detection devices such that the status detection device detects a status of the first fuse and a status of the second fuse based on comparison between a detection result of the first voltage and a detection result of the second voltage.

According to another aspect of the present invention, a status detection apparatus for a power conversion device includes a first fuse positioned on a first phase of a 3-phase AC power source between a power conversion device and the 3-phase AC power source, a second fuse positioned on a second phase of the 3-phase AC power source between the power conversion device and the 3-phase AC power source, a first voltage detection device which detects first voltage between a third phase of the 3-phase AC power source and the first phase of the 3-phase AC power source on a power conversion device side with respect to the first fuse, a second voltage detection device which detects second voltage between the third phase of the 3-phase AC power source and the second phase of the 3-phase AC power source on a power conversion device side with respect to the second fuse, and a status detection device connected to the first and second voltage detection devices such that the status detection device detects a status of the first fuse and a status of the second fuse based on comparison between a detection result of the first voltage and a detection result of the second voltage.

According to yet another aspect of the present invention, a method for detecting status of a power conversion device includes detecting first voltage between a third phase of a 3-phase AC power source and a first phase of the 3-phase AC power source on a power conversion device side with respect to a first fuse positioned on the first phase of the 3-phase AC power source between the power conversion device and the 3-phase AC power source, detecting second voltage between the third phase of the 3-phase AC power source and a second phase of the 3-phase AC power source on a power conversion device side with respect to a second fuse positioned on the second phase of the 3-phase AC power source between the power conversion device and the 3-phase AC power source, and detecting a status of the first fuse and a status of the second fuse based on comparison between a detection result of the first voltage and a detection result of the second voltage.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings. By referring to the accompanying drawings, detailed descriptions are provided below for the power conversion apparatus, status detection device and status detection method according to the embodiments disclosed in the present application. However, the present invention is not limited to the embodiments below.

Structural Example of Power Conversion Apparatus

Figure 1:
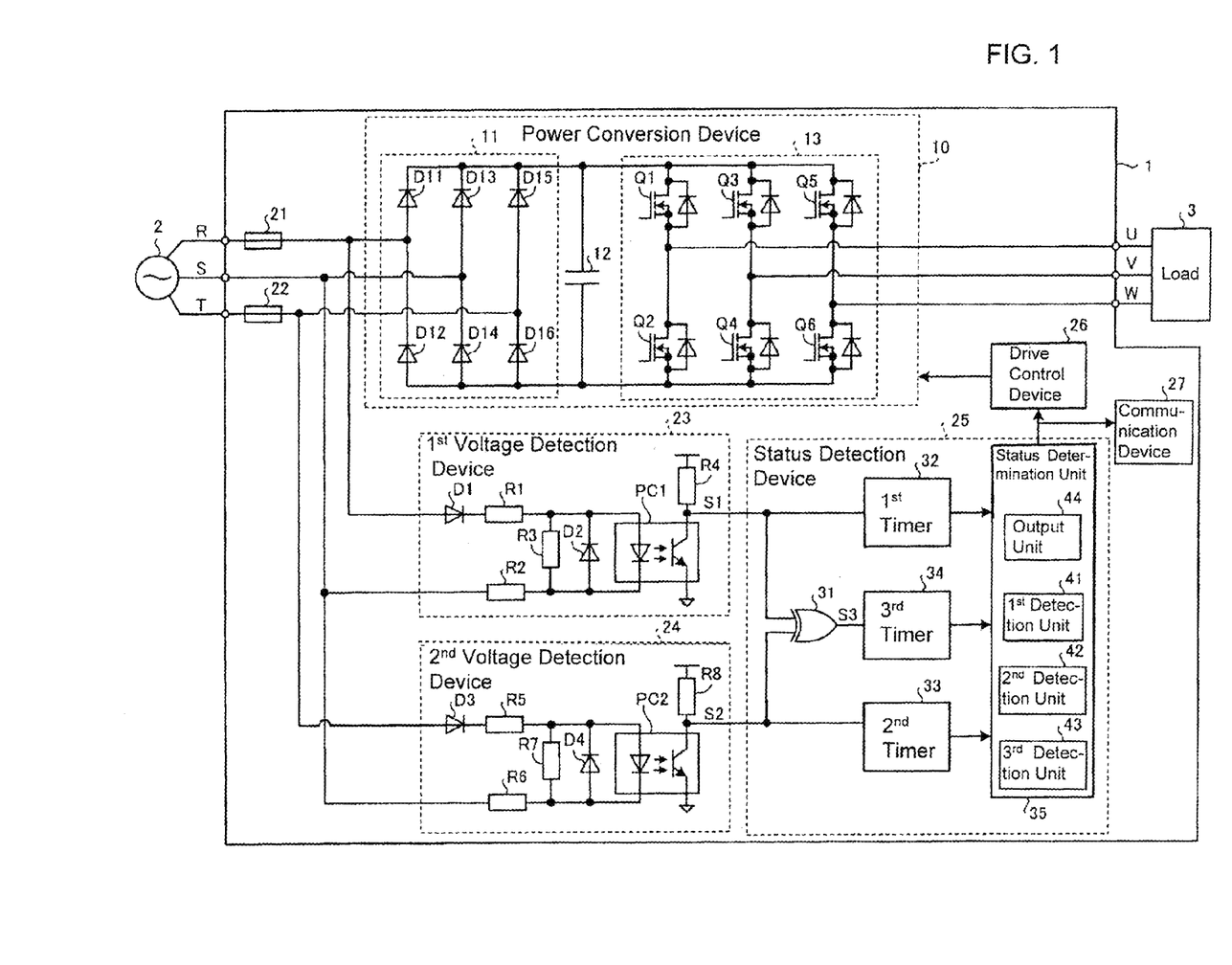
FIG. 1 is a diagram showing a structural example of a power conversion apparatus according to an embodiment of the present invention.

FIG. 1 is a diagram showing a structural example of the power conversion apparatus according to an embodiment of the present invention. As shown in FIG. 1, power conversion apparatus 1 of a first embodiment is connected to 3-phase AC power source 2 (hereinafter referred to as power source 2) and load 3. Load 3 is an AC motor, for example.

Power conversion apparatus 1 has power conversion device 10, first fuse 21, second fuse 22, first voltage detection device 23, second voltage detection device 24, status detection device 25, drive control device 26 and communication device 27.

Power conversion device 10 has 3-phase rectifier 11, smoothing capacitor 12, and inverter circuit 13. Three-phase rectifier 11 is provided with multiple 3-phase bridge diodes (D11~D16), and rectifies 3-phase AC voltage supplied from power source 2. Smoothing capacitor 12 makes the voltage outputted from 3-phase rectifier 11 smooth. Accordingly, AC power supplied from power source 2 is converted to DC power.

Inverter circuit 13 has multiple 3-phase bridge switching elements (Q1~Q6). Antiparallel diodes are connected respectively to switching elements (Q1~Q6). Those multiple switching elements (Q1~Q6) are On/Off controlled by control signals from drive control device 26. Accordingly, DC power converted by 3-phase rectifier 11 and smoothing capacitor 12 is converted to AC power and supplied to load 3 from power conversion apparatus 1.

Switching elements (Q1~Q6) are, for example, metal-oxide semiconductor field-effect transistors (MOSFET) or insulated gate bipolar transistors (IGBT). Power conversion device 10 shown in FIG. 1 has 3-phase rectifier 11. However, it is sufficient as long as it has a structure capable of converting power. For example, it may be a converter capable of regenerating power. In addition, power conversion device 10 may be a matrix converter, for example First fuse 21 is provided between the R phase (an example of a first phase) of power source 2 and power conversion device 10, and second fuse 22 is provided between the T phase (an example of a second phase) of power source 2 and power conversion device 10.

First voltage detection device 23 detects voltage (Vrs) between the power conversion device 10 side of first fuse 21 and the S phase (an example of a third phase) of power source 2. As shown in FIG. 1, first voltage detection device 23 has, for example, diode (D1) connected in series between the power conversion device 10 side of first fuse 21 and the S phase of power source 2, resistors (R1, R2), and photocoupler (PC1). Diode (D2) and resistor (R3) are connected in parallel to photocoupler (PC1). Resistor (R4) is a pull-up resistor connected to the output of photocoupler (PC1).

First voltage detection device 23 shown in FIG. 1 outputs a low-level detection signal (S1), for example, when the instantaneous value of voltage (Vrs) is at a positive threshold voltage (Vth1) or greater, and outputs a high-level detection signal (S1) when the instantaneous value of voltage (Vrs) is less than the threshold voltage (Vth1). Here, the threshold voltage (Vth1) is adjustable by adjusting the value at resistors (R1~R3).

Second voltage detection device 24 detects voltage (Vts) between the power conversion device 10 side of second fuse 22 and the T phase (an example of a second phase) of power source 2. As shown in FIG. 1, second voltage detection device 24 has, for example, diode (D3) connected in series between the power conversion device 10 side of second fuse 22 and the S phase of power source 2, resistors (R5, R6), and photocoupler (PC2). Diode (D4) and resistor (R7) are connected in parallel to photocoupler (PC2). Resistor (R8) is a pull-up resistor connected to the output of photocoupler (PC2).

Second voltage detection device 24 shown in FIG. 1 outputs a low-level detection signal (S2) when the instantaneous value of voltage (Vts) is at a positive threshold voltage (Vth2) or greater, and outputs a high-level detection signal (S2) when the instantaneous value of voltage (Vts) is less than the threshold voltage (Vth2). Here, the threshold voltage (Vth2) is adjustable by adjusting the value at resistors (R5~R7).

Status detection device 25 detects the statuses of first and second fuses (21, 22), the status of power source 2, and the status of power conversion device 10 based on the detection results in first voltage detection device 23 and second voltage detection device 24.

Status detection device 25 has exclusive OR unit 31 (an operation unit), first through third timers (32~34), and status determination unit 35. Exclusive OR unit 31 computes the exclusive OR of detection signals (S1, S2) and outputs the results to third timer 34. For convenience purposes, the output from exclusive OR unit 31 is referred to as detection signal (S3).

First timer 32 counts time while the level of detection signal (S1) continues to be high, and resets the count value when the level of detection signal (S1) is low. Second timer 33 counts time while the level of detection signal (S2) continues to be high, and resets the count value when the level of detection signal (S2) is low. Third timer 34 counts time while the level of detection signal (S3) continues to be low, and resets the count value when the level of detection signal (S3) is high.

Status determination unit 35 detects the statuses of first and second fuses (21, 22), the status of power source 2, and the status of power conversion device 10 based on the values counted by first through third timers (32~34). Status determination unit 35 has first through third detection units (41~43), and output unit 44.

When the count value at first timer 32 is a threshold value (Tc1) or greater, for example, first detection unit 41 determines that there is an abnormality. Threshold value (Tc1) is set not to exceed the count value at first timer 32 when neither power conversion apparatus 1 nor power source 2 has an abnormality.

When the count value at second timer 33 is a threshold value (Tc2) or greater, for example, second detection unit 42 determines that there is an abnormality. Threshold value (Tc2) is set not to exceed the count value at second timer 33 when neither power conversion apparatus 1 nor power source 2 has an abnormality.

When the count value at third timer 34 is a threshold value (Tc3) or greater, for example, third detection unit 43 determines that there is an abnormality. Threshold value (Tc3) is set not to exceed the count values at first through third timers (32~34) when neither power conversion apparatus 1 nor power source 2 has an abnormality.

Status Determination Process at Status Determination Unit

Figure 2:
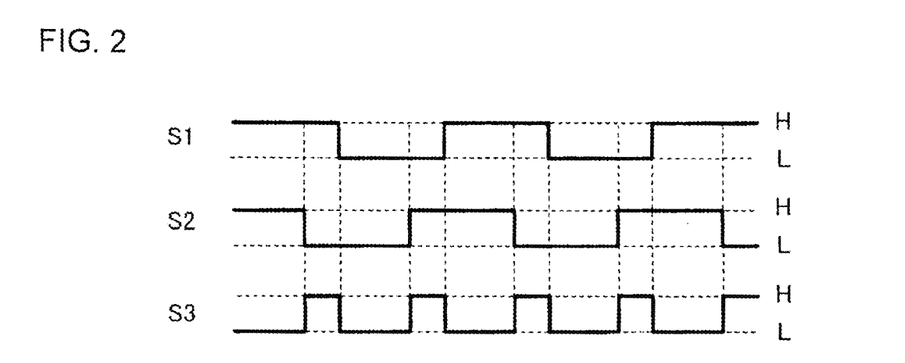
FIG. 2 is a view showing detection signals observed when neither the power conversion apparatus nor the power source has an abnormality.

Status determination procedures by status determination unit 35 are described in the following. FIG. 2 is a view showing detection signals (S1~S3) observed when neither power conversion apparatus 1 nor power source 2 has an abnormality.

When neither power conversion apparatus 1 nor power source 2 has an abnormality, detection signals (S1, S2) turn to a high level in each cycle (Ta1) (=1/fp) corresponding to the frequency (fp) of power source 2 as shown in FIG. 2.

On the other hand, since detection signal (S3) is the result of computing the exclusive OR of detection signals (S1, S2), the level of detection signal (S3) is high when the level of detection signal (S1) and the level of detection signal (S2) differ from each other, whereas it is low when the level of detection signal (S1) and the level of detection signal (S2) are the same as each other.

The phase difference of voltage (Vts) with respect to voltage (Vrs) is 60 degrees. Due to such a phase difference, detection signal (S3) turns to a high level in each cycle (Ta2) (=1/2fp) corresponding to the frequency (fp) of power source 2.

When detection signals (S1, S2) turn to a low level in each cycle (Ta1) and when detection signal (S3) turns to a high level in each cycle (Ta2), status determination unit 35 determines that there is no abnormality based on count values at first through third timers 32~34.

When detection signals (S1, S2) turn to a low level in each cycle (Ta1) and detection signal (S3) turns to a high level in each cycle (Ta2), the count values at first through third timers (32~34) do not exceed threshold values (tc1~tc3). Thus, first through third detection units (41~43) all determine that there is no abnormality. When first through third detection units (41~43) determine that there is no abnormality, output unit 44 outputs information to drive control device 26 that there is no abnormality.

Figure 3A:
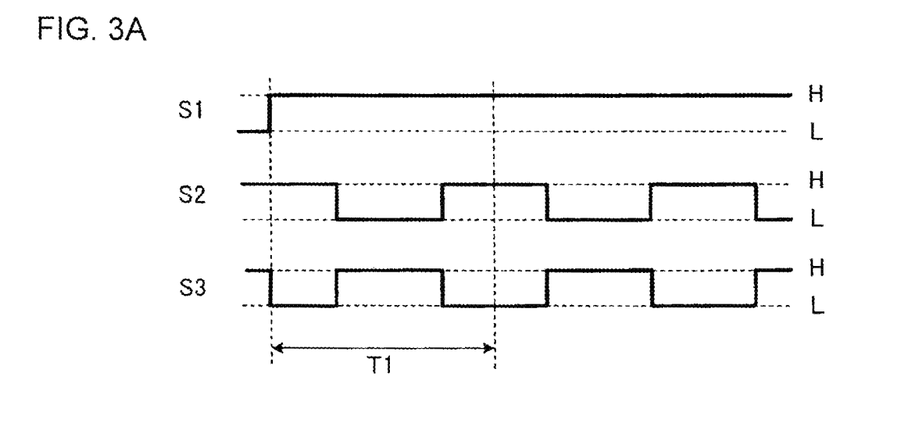
FIG. 3A is a view showing detection signals observed when a first fuse melts.

FIG. 3A is a view showing detection signals (S1~S3) observed when first fuse 21 melts. As shown in FIG. 3A, when first fuse 21 melts, detection signal (S1) turns to a high level and remains high in each cycle (Ta1). Thus, when detection signal (S1) is observed to be what is shown in FIG. 3A, status determination unit 35 determines that first fuse 21 has melted.

For example, when first fuse 21 melts, since the count value at first timer 32 is at or beyond a threshold value (Tc1) (for example, the count value in period (T1)), first detection unit 41 determines that there is an abnormality. On the other hand, since detection signals (S2, S3) are observed to be the same as in FIG. 2, second and third detection units (42, 43) determine that there is no abnormality. When only first detection unit 41 detects an abnormality, output unit 44 outputs information to drive control device 26 that first fuse 21 has melted.

Figure 3B:
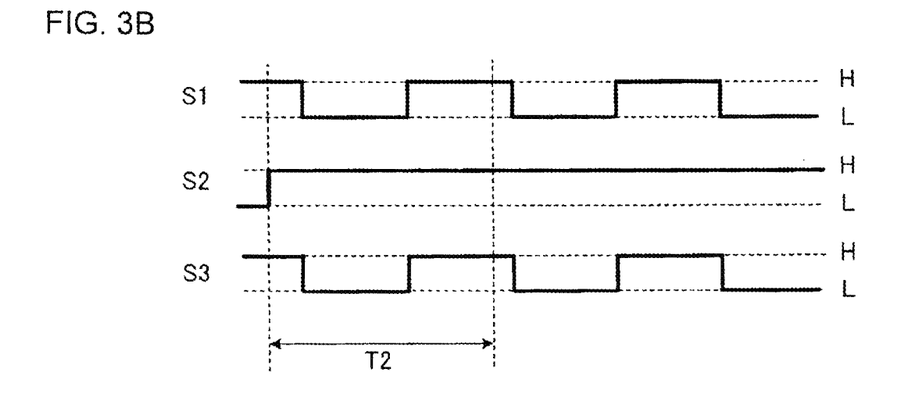
FIG. 3B is a view showing detection signals observed when a second fuse melts.

FIG. 3B is a view showing detection signals (S1~S3) observed when second fuse 22 melts. As shown in FIG. 3B, when second fuse 22 melts, detection signal (S2) turns to a high level and remains high in each cycle (Ta1). Thus, when detection signal (S2) is observed to be what is shown in FIG. 3B, status determination unit 35 determines that second fuse 22 has melted.

For example, when second fuse 22 melts, since the count value at second timer 33 is at or beyond a threshold value (Tc2) (for example, the count value in period (T2)), second detection unit 42 determines that there is an abnormality. On the other hand, since detection signals (S1, S3) are observed to be the same as in FIG. 2, first and third detection units (41, 43) determine that there is no abnormality. When only second detection unit 42 detects an abnormality, output unit 44 outputs information to drive control device 26 that second fuse 22 has melted.

Figure 3C:
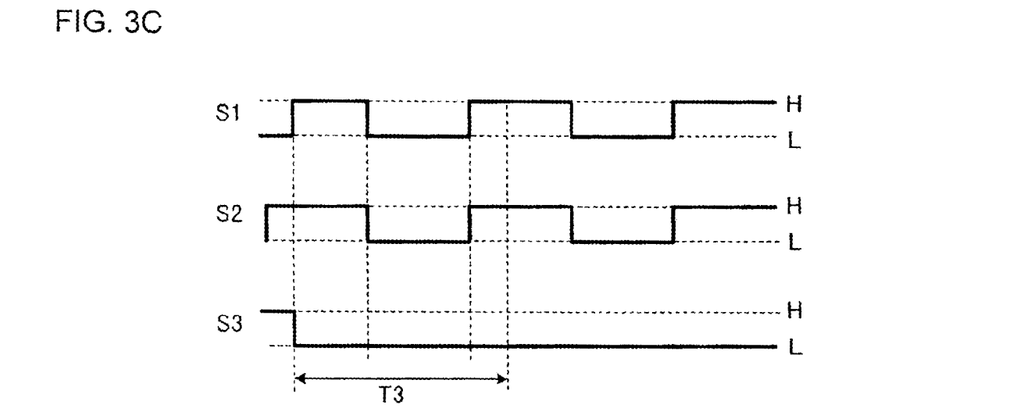
FIG. 3C is a view showing detection signals observed when a first fuse melts and a diode is shorted.
Figure 3D:
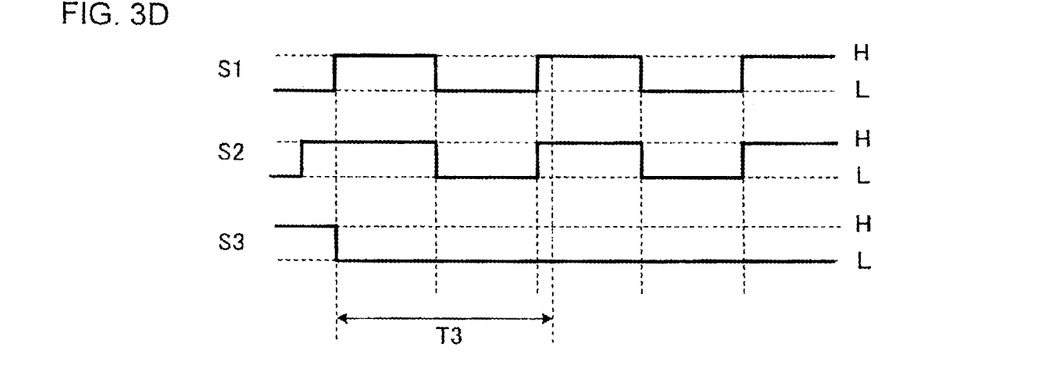
FIG. 3D is a view showing detection signals observed when a second fuse melts and a diode is shorted.

FIG. 3C is a view showing detection signals (S1~S3) observed when first fuse 21 melts and diode (D11) is shorted, whereas FIG. 3D is a view showing detection signals (S1~S3) observed when second fuse 22 melts and diode (D15) is shorted. Also, FIG. 4 is a view showing the current flow observed when first fuse 21 melts and diode (D11) is shorted, whereas FIG. 5 is a view showing the current flow observed when second fuse 22 melts and diode (D15) is shorted.

Figure 4:
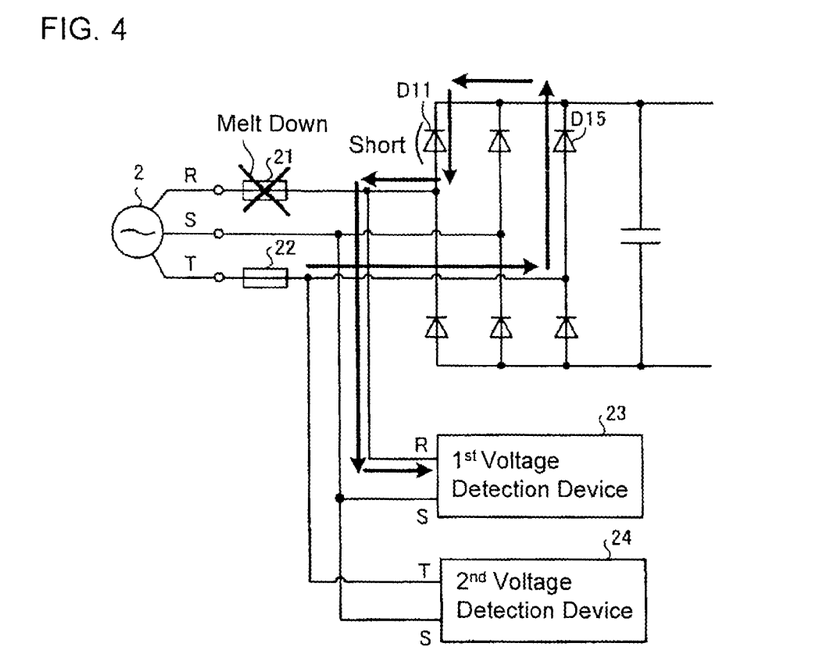
FIG. 4 is a view showing the current flow when a first fuse melts and a diode is shorted.

When first fuse 21 melts and diode (D11) is shorted, as shown in FIG. 4, the current from the T phase of power source 2 flows into the R phase input of first voltage detection device 23. Accordingly, as shown in FIG. 3C, detection signal (S1) continuously turns to a low level in each cycle (Ta1), and the melted state of first fuse 21 cannot be detected from such a detection signal (S1).

Figure 5:
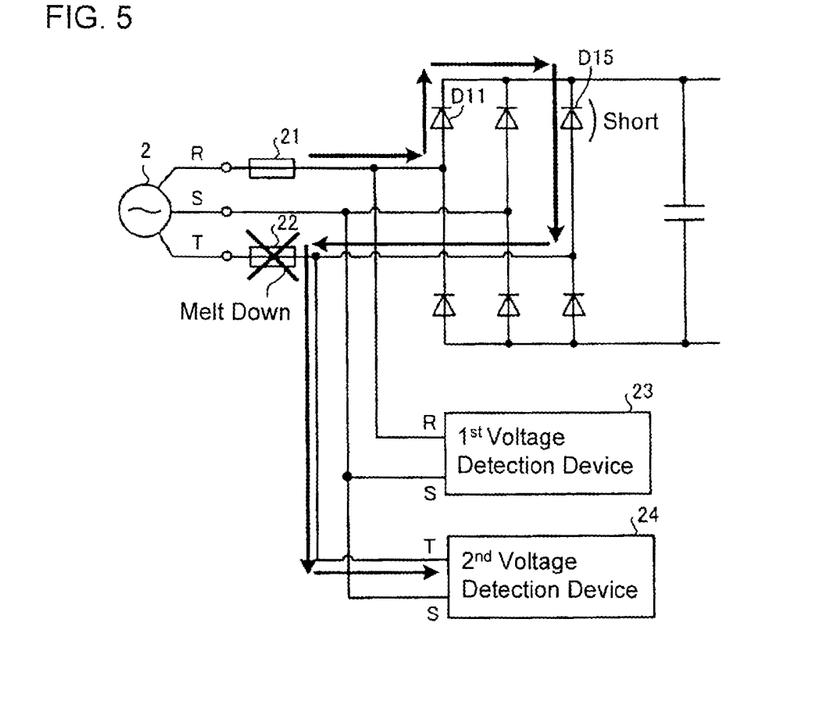
FIG. 5 is a view showing the current flow when a second fuse melts and a diode is shorted.

When second fuse 22 melts and diode (D15) is shorted, as shown in FIG. 5, the current from the R phase of power source 2 flows into the T phase input of second voltage detection device 24. Accordingly, as shown in FIG. 3D, detection signal (S2) continuously turns to a low level in each cycle (Ta1), and the melted state of second fuse 22 cannot be detected from such a detection signal (S2).

On the other hand, when signals are observed to be what is shown in FIG. 3C, detection signal (S3) stays at a low level and remains low in each cycle (Ta2). That is because first voltage detection device 23 detects voltage (Vts) between the T phase and S phase the same as second voltage detection device 24 does, and there is no lag between detection signals (S1, S2).

Also, when signals are observed to be what is shown in FIG. 3D, detection signal (S3) stays at a low level and remains low in each cycle (Ta2). That is because second voltage detection device 24 detects voltage (Vrs) between the R phase and S phase the same as first voltage detection device 23 does, and there is no lag between detection signals (S1, S2).

When detection signal (S3) is observed to be what is shown in FIG. 3C or FIG. 3D, status determination unit 35 determines first fuse 21 or second fuse 22 has melted. In addition, in such a situation, status determination unit 35 may also determine that diode (D11) or diode (D15) is shorted.

For example, when detection signal (S3) is observed to be what is shown in FIG. 3C or FIG. 3D, since the count value at third timer 34 is at or beyond a threshold value (Tc3) (for example, the count value in period (T3)), third determination unit 43 determines that there is an abnormality. On the other hand, since detection signals (S1, S2) turn to a low level in each cycle (Ta1) and the count values by first and second timers (32, 33) do not exceed the threshold values, first and second detection units (41, 42) determine that there is no abnormality.

When only third detection unit 43 determines that there is an abnormality, output unit 44 outputs information to drive control device 26 that either first fuse 21 or second fuse 22 has melted. When only third detection unit 43 determines that there is an abnormality, output unit 44 may also output information to drive control device 26 that either diode (D11) or diode (D15) is shorted.

Figure 3E:
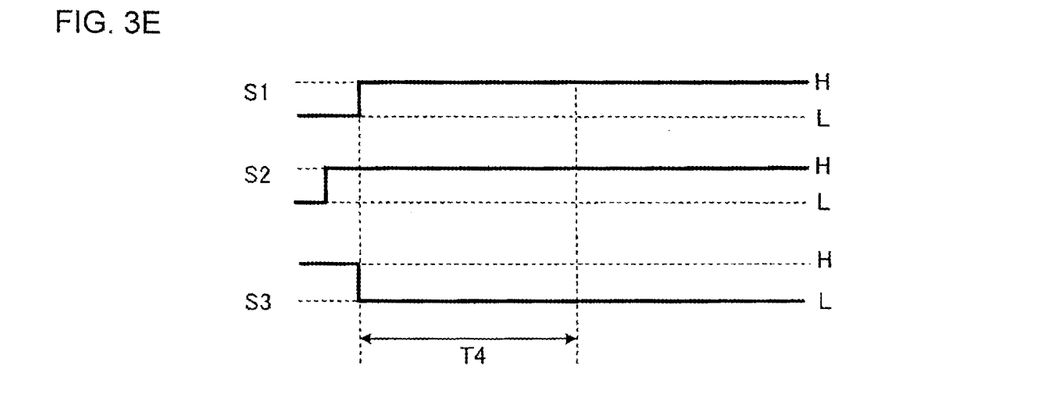
FIG. 3E is a view showing detection signals observed in the event of a power outage at the power source.

FIG. 3E is a view showing detection signals (S1~S3) observed when a power outage occurs in power source 2. As shown in FIG. 3E, in the event of a power outage in power source 2, levels of detection signals (S1, S2) are high while the level of detection signal (S3) is low. Thus, status determination unit 35 determines that a power outage has occurred in power source 2.

When detection signals (S1~S3) are observed to be what is shown in FIG. 3E, since the count values at first through third timers are at or beyond threshold values (Tc1~Tc3), first through third detection units (41~43) all determine that there is an abnormality. When first through third detection units (41~43) all determine that there is an abnormality, output unit 44 outputs information to drive control device 26 that a power outage has occurred in power source 2. When both first and second detection units (41, 42) determine that there is an abnormality, output unit 44 may also output information to drive control device 26 that a power outage has occurred in power source 2.

When notified by status detection device 25 that there is an abnormality, drive control device 26 stops control of the inverter circuit 13, for example. In addition, communication device 27 can also output the abnormality information to an outside device. The abnormality information outputted to the outside device (a display device, for example) shows, for example, the melted state of first fuse 21, the melted state of second fuse 22, or a power outage of power source 2. It is an option for power conversion apparatus 1 to have a display device so that abnormality information will be displayed when an abnormality occurs.

Status detection device 25 and drive control device 26 contain a microcomputer having a CPU (central processing unit), ROM (read-only memory), RAM (random access memory), input/output ports and the like as well as various circuits. The CPU of the microcomputer carries out the above-mentioned controls by reading and executing a program stored in the ROM.

Processing Flow by Status Detection Device

Figure 6:
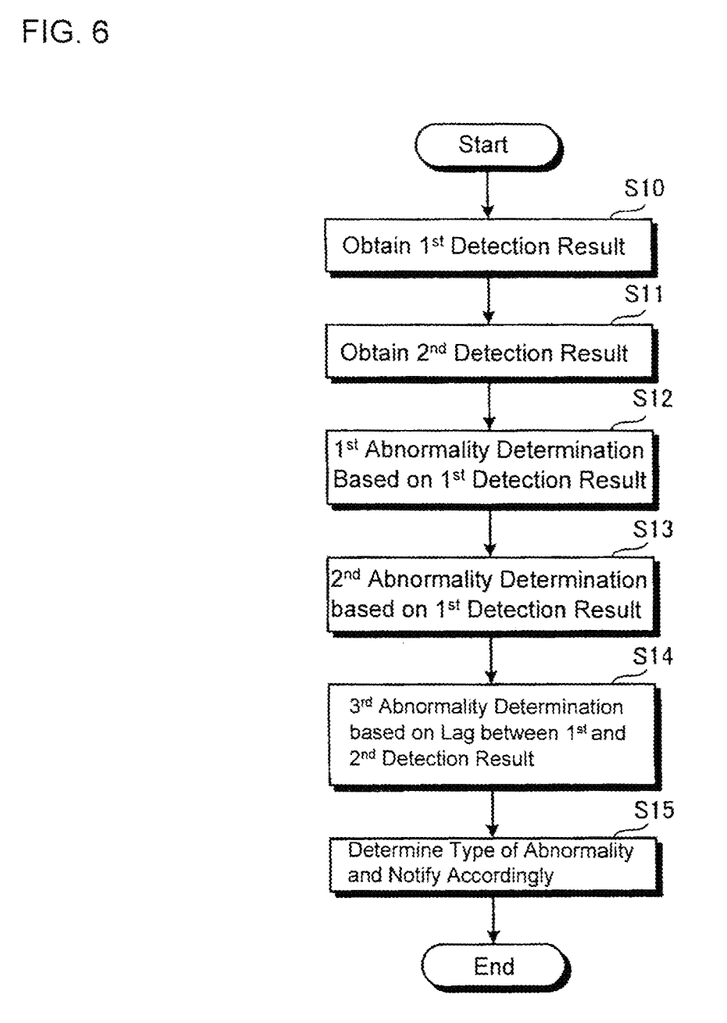
FIG. 6 is a flowchart showing an example of procedures performed by the status detection device.

FIG. 6 is a flowchart showing an example of the processing flow conducted by status detection device 25. Status detection device 25 repeats the procedures shown in FIG. 6 at a predetermined cycle.

As shown in FIG. 6, status detection device 25 receives detection signal (S1) outputted from first voltage detection device 23 as a first detection result (step S10), and detection signal (S2) outputted from second voltage detection device 24 as a second detection result (step S11).

Based on the first detection result, status detection device 25 makes a first abnormality determination (step S12). For example, status detection device 25 determines that there is an abnormality when detection signal (S1) as a first detection result continues at a high level for a predetermined period or longer.

Based on the second detection result, status detection device 25 makes a second abnormality determination (step S13). For example, status detection device 25 determines that there is an abnormality when detection signal (S2) as a second detection result continues at a high level for a predetermined period or longer.

In addition, status detection device 25 conducts a third abnormality determination by comparing the first detection result and the second detection result (step S14). For example, status detection device 25 computes the exclusive OR of detection signal (S1) and detection signal (S2), and determines the presence of an abnormality when the result indicates a continuous low level for a predetermined period or longer.

Next, based on the first through third abnormality determinations, status detection device 25 determines the type of an abnormality and notifies drive control device 26 accordingly (step S15). For example, when only the first determination result is abnormal, status detection device 25 determines that first fuse 21 has melted, whereas when only the second determination result is abnormal, status detection device 25 determines that second fuse 22 has melted.

Further, when only the third determination result is abnormal, status detection device 25 determines that first fuse 21 or second fuse 22 has melted, whereas when the first through third determination results are all abnormal, status detection device 25 determines that a power outage has occurred in power source 2.

As described above, based on detection signals (S1, S2), power conversion apparatus 1 is capable of detecting the melted state of first fuse 21, the melted state of second fuse 22 and a power outage in power source 2. Furthermore, when diode (D11) or diode (D15) is shorted, power conversion apparatus 1 is also capable of detecting the melted state of first fuse 21 or the melted state of second fuse 22, based on the results of comparing detection signal (S1) and detection signal (S2).

Since detection signal (S3) differs in FIG. 2 from those in FIGS. 3A~3E, status detection device 25 is also capable of detecting abnormalities from a change in signal patterns. For example, based on whether or not detection signal (S3) continues to be at a low level for a predetermined period or longer, status detection device 25 can detect a melted state in either of first fuse 21 and second fuse 22 along with a power outage in power source 2.

In such a case, it is an option for status detection device 25 not to include, for example, first and second timers (32, 33) and first and second detection units (41, 42). When detection signal (S3) continues at a low level longer than the period shown in FIG. 2 or when the cycle to turn to a low level is changed from cycle (Ta2) to cycle (Ta1), third detection unit 43 detects that either first fuse 21 or second fuse 22 has melted. When detection signal (S3) continues at a low level longer than the period of cycle (Ta1), for example, third detection unit 43 detects that a power outage has occurred in power source 2.

Furthermore, first voltage detection device 23 outputs a low-level detection signal (S1) when voltage (Vrs) is positive between the S phase and the power conversion device 10 side of first fuse 21. Second voltage detection device 24 outputs a low-level detection signal (S2) when voltage (Vts) is positive between the S phase and the power conversion device 10 side of second fuse 22. Accordingly, status detection device 25 can be structured with digital circuits, resulting, for example, in a smaller low-cost device.

In first voltage detection device 23, diodes (D1, D2) and photocoupler (PC1) may be arranged in an opposite direction. In such a case, first voltage detection device 23 outputs a low-level detection signal (S1) when voltage (Vrs) is negative between the S phase and the power conversion device 10 side of first fuse 21.

In the same manner, in second voltage detection device 24, diodes (D3, D4) and photocoupler (PC2) may also be arranged in an opposite direction. In such a case, second voltage detection device 24 outputs a low-level detection signal (S2) when voltage (Vts) is negative between the S phase and the power conversion device 10 side of second fuse 22.

Power conversion apparatus 1 shown in FIG. 1 achieves, for example, low cost and a smaller size, since there is no fuse positioned between the S phase of power source 2 and power conversion device 10. However, a fuse may be provided between the S phase of power source 2 and power conversion device 10 in power conversion apparatus 1.

In the above, status determination unit 35 is set to determine the melted state of first fuse 21 or second fuse 22 from the period of a low-level detection signal (S3). However, the method for determining a melted state is not limited to the period of a low-level detection signal (S3).

For example, when the percentage of a low-level detection signal (S3) within a predetermined period is at or beyond a predetermined threshold value (80%, for example), status determination unit 35 can also determine the melted state of first fuse 21 or second fuse 22. Accordingly, even when there is a minor lag between detection signal (S1) and detection signal (S2) derived from differences in individual devices used for first voltage detection device 23 and second voltage detection device 24, a melted state of first fuse 21 or second fuse 22 can be detected.

In power conversion apparatus 1 shown in FIG. 1, exclusive OR unit 31 compares detection signal (S1) and detection signal (S2). However, comparing detection signal (S1) and detection signal (S2) is not limited to comparison by exclusive OR unit 31.

For example, exclusive OR unit 31 may be replaced with a comparator in power conversion apparatus 1. In such a case, the comparator outputs a low-level detection signal (S3) when the difference between detection signal (S1) and detection signal (S2) is less than a predetermined value, whereas it outputs a high-level detection signal (S3) when the difference between detection signal (S1) and detection signal (S2) is a predetermined value or greater. Here, by setting the comparator to be a hysteresis comparator, it is made less vulnerable to differences in individual devices used for first voltage detection device 23 and second voltage detection device 24.

Figure 7:
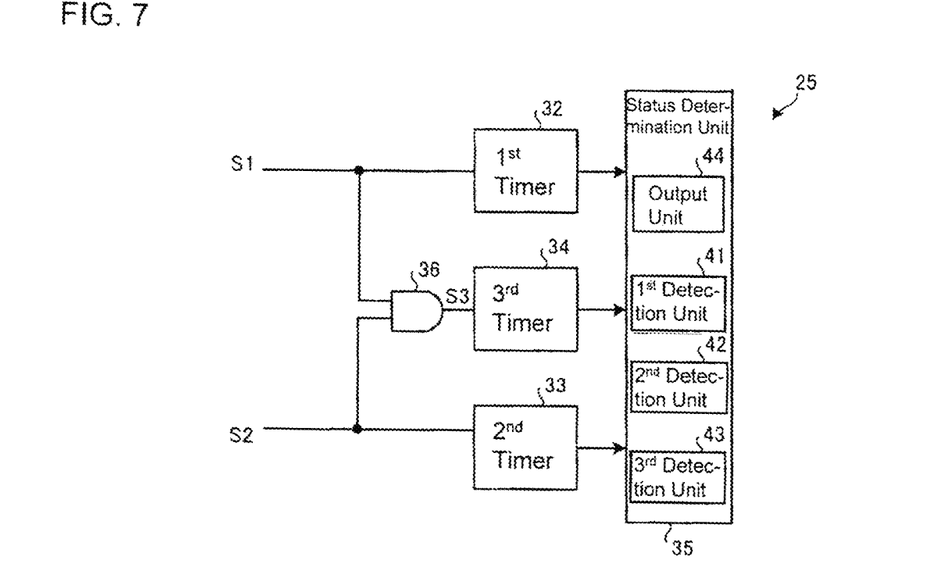
FIG. 7 is a diagram showing an example of a status detection device having a different structure from that of the status detection structure shown in FIG. 1.

In power conversion apparatus 1, exclusive OR unit 31 may also be replaced with AND unit 36 (an operation unit) that computes AND operations of detection signal (S1) and detection signal (S2). FIG. 7 shows an example of status detection device 25 with a different structure from that of status detection device 25 shown in FIG. 1.

Status determination unit 35 in status detection device 25 shown in FIG. 7 is capable of detecting a melted state of first fuse 21 or second fuse 22 based on the period of a low-level detection signal (S3), even when detection signals (S1, S2) are at a low level in each cycle (Ta1).

Figure 8A:
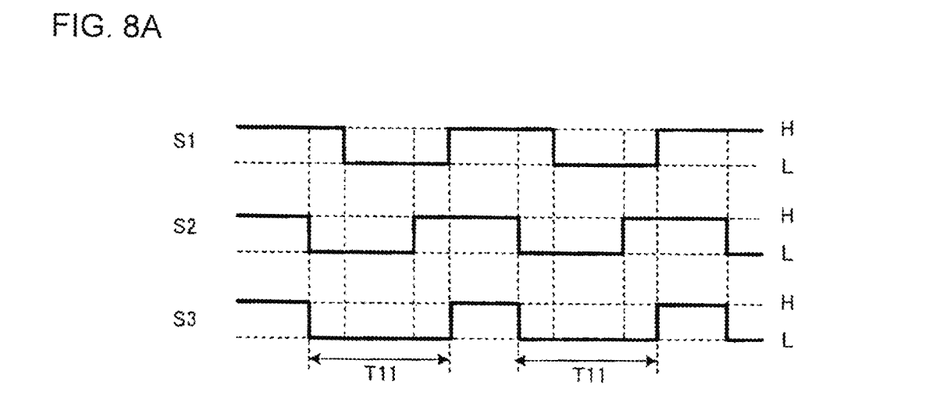
FIG. 8A is a view showing detection signals from the status detection device shown in FIG. 7, observed when neither the power conversion apparatus nor a power source has an abnormality.
Figure 8B:
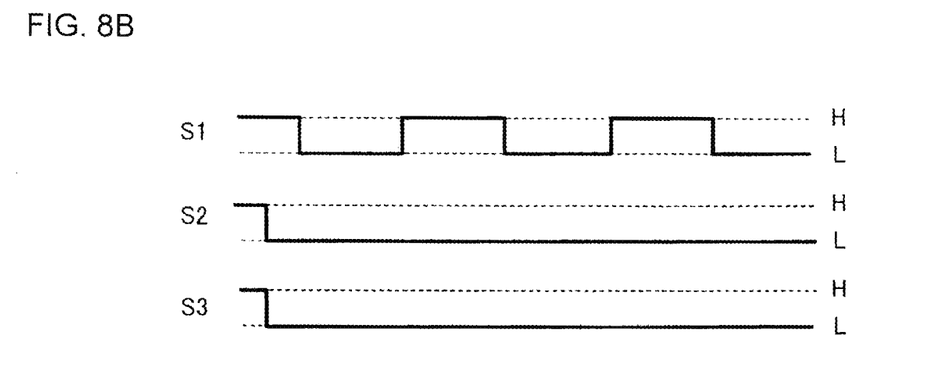
FIG. 8B is a view showing detection signals from the status detection device shown in FIG. 7, observed when a second fuse melts.
Figure 8C:
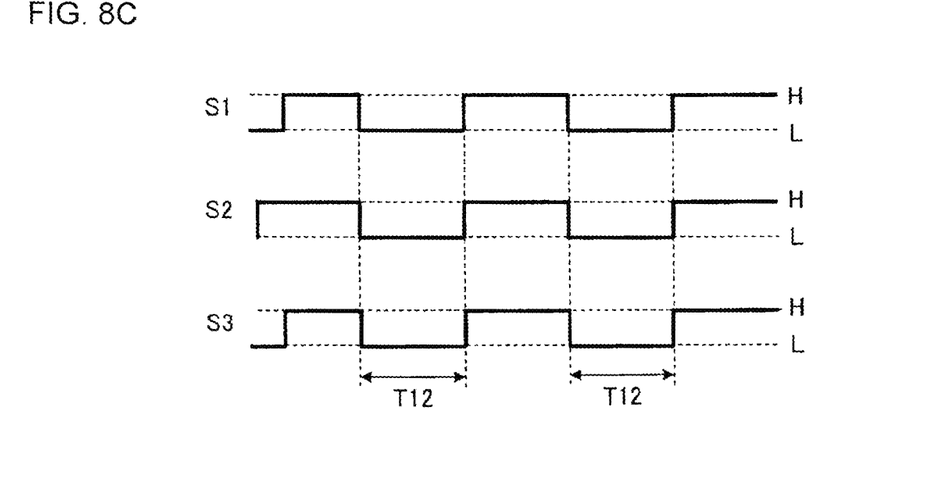
FIG. 8C is a view showing detection signals from the status detection device shown in FIG. 7, observed when a first fuse melts and a diode is shorted.

FIGS. 8A-8C show detection signals (S1~S3) in status detection device 25 shown in FIG. 7. FIG. 8A is a view showing detection signals (S1~S3) observed when neither power conversion apparatus 1 nor power source 2 has an abnormality; FIG. 8B is a view showing detection signals (S1~S3) observed when second fuse 22 melts; and FIG. 8C is a view showing detection signals (S1~S3) observed when first fuse 21 melts and diode (D11) is shorted.

Since detection signal (S3) in FIG. 8B continues to be at a low level, the period of low level is longer than period (T11) of a low-level detection signal (S3) shown in FIG. 8A. The same is observed when second fuse 22 melts and diode (D15) is shorted. Also, period (T12) of a low-level detection signal (S3) shown in FIG. 8C is shorter than period (T11) of a low-level detection signal (S3) shown in FIG. 8A. Accordingly, when detection signal (S3) continues to be at a low level for period (T13) or shorter or for period (T14) or longer, status determination unit 35 detects that either first fuse 21 or second fuse 22 has melted. Period (T13) is, for example, longer than period (T12) but shorter than period (T11). Period (T14) is, for example, longer than period (T11).

In power conversion apparatus 1, AND unit 36 may be replaced with another AND (an operation unit). When first fuse 21 melts and diode (D11) is shorted, the period of a low-level detection signal (S3) outputted from the AND unit is longer than the period of a low-level detection signal (S3) outputted in normal conditions. The same is observed when second fuse 22 melts and diode (D15) is shorted. Therefore, status determination unit 35 is capable of detecting a melted state of first fuse 21 or second fuse 22 when detection signal (S3) outputted from the AND unit continues to be at a low level for a predetermined period or longer.

In the above embodiments, first and second voltage detection devices (23, 24) output a low-level signal when a voltage is detected. However, first and second voltage detection devices (23, 24) may also be set to output a high-level signal when a voltage is detected. For example, first detection device 23 may be provided with an inverter that inverts a level outputted from photocouplers (PC1, PC2).

In such a case, first timer 32 counts time while detection signal (S1) continues to be low, and resets the count value when detection signal (S1) is at a high level. Second timer 33 counts time while detection signal (S2) continues to be low, and resets the count value when the detection signal (S2) is at a high level.

Furthermore, in the above embodiments, low and high levels of detection signals (S1~S3) are counted by first through third timers (32~34). However, it is an option not to use first through third timers (32~34). For example, first through third timers (32~34) may each be replaced with an analog circuit having time constant, which is capable of detecting when detection signals (S1~S3) continue to be at a low level or a high level for a predetermined period or longer.

The above embodiments describe when detection signals (S1, S2) have binary levels. However, detection signals (S1, S2) may be alternating signals that change according to instantaneous values of voltages (Vrs, Vts). In such a case, status detection device 25 is provided with an operational amplifier that outputs differential voltage between detection signal (S1) and detection signal (S2) as detection signal (S3), and first through third detection units (41~43) detect an abnormality when effective values in detection signals (S1~S3) are at a predetermined value or lower.

A power conversion apparatus may have, for example, a power conversion device to convert power between a 3-phase AC power source and a load. Between a 3-phase AC power source and the power conversion device, a fuse may be provided as protection circuitry for each phase of the 3-phase power source. To detect the melted state of such a fuse, the status of a fuse may be detected based on the state of a mechanical contact switch that is turned on when a fuse melts. However, using a mechanical contact switch makes it difficult to produce a smaller, low-cost apparatus.

To detect the status of a fuse based on the voltage outputted from a rectifier diode, for example, it may take longer for such detection of the status of a fuse, or it may be difficult to detect the status of a fuse when a load current is weak.

A power conversion apparatus according to an embodiment of the present invention is structured to have a power conversion device, first and second fuses, first and second voltage detection devices, and a status detection device. The power conversion device converts power. Among the first through third phases of a 3-phase AC power source, the first fuse is provided between the first phase and the power conversion device. The second fuse is provided between the second phase and the power conversion device. The first voltage detection device detects the voltage between the third phase and the power conversion device side of the first fuse. The second voltage detection device detects the voltage between the third phase and the power conversion device side of the second fuse. Based on the result of comparing the detection result of the first voltage detection device and the detection result of the second voltage detection device, the status detection device detects the status of the first fuse or the second fuse.

A power conversion apparatus, status detection device and status detection method according to embodiments of the present invention are capable of detecting the status of a fuse.

Obviously, numerous modifications and variations of the present invention are possible in light of the above teachings. It is therefore to be understood that within the scope of the appended claims, the invention may be practiced otherwise than as specifically described herein.

What is claimed is:

1. A power conversion apparatus, comprising:
   a power conversion device connected to a 3-phase AC power source;
   a first fuse positioned on a first phase of the 3-phase AC power source between the power conversion device and the 3-phase AC power source;
   a second fuse positioned on a second phase of the 3-phase AC power source between the power conversion device and the 3-phase AC power source;
   a first voltage detection device configured to detect voltage between a third phase of the 3-phase AC power source and the first phase of the 3-phase AC power source on a power conversion device side with respect to the first fuse;
   a second voltage detection device configured to detect voltage between the third phase of the 3-phase AC power source and the second phase of the 3-phase AC power source on a power conversion device side with respect to the second fuse; and
   a status detection device connected to the first and second voltage detection devices such that the status detection device is configured to detect a status of the first fuse and a status of the second fuse based on comparison between a detection result of the first voltage detection device and a detection result of the second voltage detection device,
   wherein only connections between the third phase of the 3-phase AC power source and the first and second voltage detection devices are unfused.

2. The power conversion apparatus according to claim 1, wherein the status detection device includes a first detection sub-device configured to detect melting of the first fuse based on the detection result of the first voltage detection device, a second detection sub-device configured to detect melting of the second fuse based on the detection result of the second voltage detection device, and a third detection sub-device configured to detect the status of the first fuse or the second fuse based on comparison between the detection result of the first voltage detection device and the detection result of the second voltage detection device.

3. The power conversion apparatus according to claim 2, wherein the first voltage detection device is configured to detect positive or negative voltage between the third phase of the 3-phase AC power source and the first phase of the 3-phase AC power source on the power conversion device side with respect to the first fuse, and the second voltage detection device is configured to detect positive or negative voltage between the third phase of the 3-phase AC power source and the second phase of the 3-phase AC power source on the power conversion device side with respect to the second fuse.

4. The power conversion apparatus according to claim 2, wherein the status detection device includes an operation device configured to conduct exclusive OR operation of the detection result of the first voltage detection device and the detection result of the second voltage detection device, and the third detection sub-device is configured to detect the status of the first fuse and the status of the second fuse based on the exclusive OR operation of the operation device.

5. The power conversion apparatus according to claim 3, wherein the status detection device includes an operation device configured to conduct exclusive OR operation of the detection result of the first voltage detection device and the detection result of the second voltage detection device, and the third detection sub-device is configured to detect the status of the first fuse and the status of the second fuse based on the exclusive OR operation of the operation device.

6. The power conversion apparatus according to claim 4, wherein the operation device of the status detection device is configured to output a first operation result when the detection result of the first voltage detection device and the detection result of the second voltage detection device are determined to be same and output a second operation result different from the first operation result when the detection result of the first voltage detection device and the detection result of the second voltage detection device are determined to be different.

7. The power conversion apparatus according to claim 5, wherein the operation device of the status detection device is configured to output a first operation result when the detection result of the first voltage detection device and the detection result of the second voltage detection device are determined to be same and output a second operation result different from the first operation result when the detection result of the first voltage detection device and the detection result of the second voltage detection device are determined to be different.

8. The power conversion apparatus according to claim 2, wherein the status detection device includes an operation device configured to conduct OR operation or AND operation of the detection result of the first voltage detection device and the detection result of the second voltage detection device, and the third detection sub-device is configured to detect the status of the first fuse and the status of the second fuse based on the OR operation or AND operation of the operation device.

9. The power conversion apparatus according to claim 3, wherein the status detection device includes an operation device configured to conduct OR operation or AND operation of the detection result of the first voltage detection device and the detection result of the second voltage detection device, and the third detection sub-device is configured to detect the status of the first fuse and the status of the second fuse based on the OR operation or AND operation of the operation device.

10. A status detection apparatus for a power conversion device, comprising:
    a first fuse positioned on a first phase of a 3-phase AC power source between a power conversion device and the 3-phase AC power source;
    a second fuse positioned on a second phase of the 3-phase AC power source between the power conversion device and the 3-phase AC power source;
    a first voltage detection device configured to detect first voltage between a third phase of the 3-phase AC power source and the first phase of the 3-phase AC power source on a power conversion device side with respect to the first fuse;
    a second voltage detection device configured to detect second voltage between the third phase of the 3-phase AC power source and the second phase of the 3-phase AC power source on a power conversion device side with respect to the second fuse; and a status detection device connected to the first and second voltage detection devices such that the status detection device is configured to detect a status of the first fuse and a status of the second fuse based on comparison between a detection result of the first voltage and a detection result of the second voltage, wherein only connections between the third phase of the 3-phase AC power source and the first and second voltage detection devices are unfused.

11. The status detection apparatus according to claim 10, wherein the status detection device includes a first detection sub-device configured to detect melting of the first fuse based on the detection result of the first voltage detection device, a second detection sub-device configured to detect melting of the second fuse based on the detection result of the second voltage detection device, and a third detection sub-device configured to detect the status of the first fuse or the second fuse based on comparison between the detection result of the first voltage detection device and the detection result of the second voltage detection device.

12. The status detection apparatus according to claim 11, wherein the first voltage detection device is configured to detect positive or negative voltage between the third phase of the 3-phase AC power source and the first phase of the 3-phase AC power source on the power conversion device side with respect to the first fuse, and the second voltage detection device is configured to detect positive or negative voltage between the third phase of the 3-phase AC power source and the second phase of the 3-phase AC power source on the power conversion device side with respect to the second fuse.

13. The status detection apparatus according to claim 11, wherein the status detection device includes an operation device configured to conduct exclusive OR operation of the detection result of the first voltage detection device and the detection result of the second voltage detection device, and the third detection sub-device is configured to detect the status of the first fuse and the status of the second fuse based on the exclusive OR operation of the operation device.

14. The status detection apparatus according to claim 12, wherein the status detection device includes an operation device configured to conduct exclusive OR operation of the detection result of the first voltage detection device and the detection result of the second voltage detection device, and the third detection sub-device is configured to detect the status of the first fuse and the status of the second fuse based on the exclusive OR operation of the operation device.

15. The status detection apparatus according to claim 13, wherein the operation device of the status detection device is configured to output a first operation result when the detection result of the first voltage detection device and the detection result of the second voltage detection device are determined to be same and output a second operation result different from the first operation result when the detection result of the first voltage detection device and the detection result of the second voltage detection device are determined to be different.

16. The status detection apparatus according to claim 14, wherein the operation device of the status detection device is configured to output a first operation result when the detection result of the first voltage detection device and the detection result of the second voltage detection device are determined to be same and output a second operation result different from the first operation result when the detection result of the first voltage detection device and the detection result of the second voltage detection device are determined to be different.

17. The status detection apparatus according to claim 11, wherein the status detection device includes an operation device configured to conduct OR operation or AND operation of the detection result of the first voltage detection device and the detection result of the second voltage detection device, and the third detection sub-device is configured to detect the status of the first fuse and the status of the second fuse based on the OR operation or AND operation of the operation device.

18. A method for detecting status of a power conversion device, comprising:
    detecting first voltage between a third phase of a 3-phase AC power source and a first phase of the 3-phase AC power source on a power conversion device side with respect to a first fuse positioned on the first phase of the 3-phase AC power source between the power conversion device and the 3-phase AC power source;
    detecting second voltage between the third phase of the 3-phase AC power source and a second phase of the 3-phase AC power source on a power conversion device side with respect to a second fuse positioned on the second phase of the 3-phase AC power source between the power conversion device and the 3-phase AC power source; and
    detecting a status of the first fuse and a status of the second fuse based on comparison between a detection result of the first voltage and a detection result of the second voltage,
    wherein only connections between the third phase of the 3-phase AC power source and the first and second voltage detection devices are unfused.

19. The method for detecting status of a power conversion device according to claim 18, wherein the detecting of the status of the first fuse and the second fuse includes detecting melting of the first fuse based on the detection result of the first voltage, detecting melting of the second fuse based on the detection result of the second voltage, and detecting the status of the first fuse or the second fuse based on comparison between the detection result of the first voltage and the detection result of the second voltage.

* * * * *